United States Patent
Wang et al.

(10) Patent No.: US 8,201,035 B2
(45) Date of Patent: Jun. 12, 2012

(54) TESTING SYSTEM AND METHOD THEREOF

(75) Inventors: Shih-Hsing Wang, Hsinchu (TW);
Kuo-Hua Lee, Yaoyuan County (TW);
Chih-Ming Cheng, Keelung (TW)

(73) Assignee: Etron Technology, Inc., Hsinchu (TW)

( * ) Notice: Subject to any disclaimer, the term of this patent is extended or adjusted under 35 U.S.C. 154(b) by 358 days.

(21) Appl. No.: 12/616,149

(22) Filed: Nov. 11, 2009

(65) Prior Publication Data
US 2010/0269001 A1    Oct. 21, 2010

(30) Foreign Application Priority Data
Apr. 21, 2009    (TW) .............................. 98113169 A (51) Int. Cl.
*G11C 29/00*    (2006.01)
(52) U.S. Cl. ......... 714/719; 714/735; 714/718; 714/6.1; 714/25; 714/42; 714/720; 714/736; 365/201
(58) Field of Classification Search .................. None
See application file for complete search history.

(56) References Cited

U.S. PATENT DOCUMENTS

6,256,243 B1 * 7/2001 Savignac et al. .............. 365/201
2009/0094497 A1 * 4/2009 Parris et al. ................... 714/735
* cited by examiner

*Primary Examiner* — John Trimmings
(74) *Attorney, Agent, or Firm* — Winston Hsu; Scott Margo (57) ABSTRACT

Testing system capable of detecting different kinds of memory faults of a memory under I/O compression includes a data pattern selection circuit, writing pattern selection units, reading pattern selection units, and a data comparison circuit. The data pattern selection circuit converts a testing data into different data patterns by the writing pattern selection units and accordingly writes to the corresponding memory data ends in order to allow the corresponding memory cells to store the data with the corresponding data pattern. The data comparison circuit executes reverse-converting through the reading pattern selection units for comparing if the data stored in the memory cells corresponding to each memory data end are matched and accordingly determines if a failure memory cell exists in the memory.

16 Claims, 6 Drawing Sheets

TESTING SYSTEM AND METHOD THEREOF

BACKGROUND OF THE INVENTION

1. Field of the Invention

The present invention relates to a testing system for a memory, and more particularly, to a testing system capable of detecting different kinds of faults for a memory under Input/Output compression (I/O compression).

2. Description of the Prior Art

Figure 1:
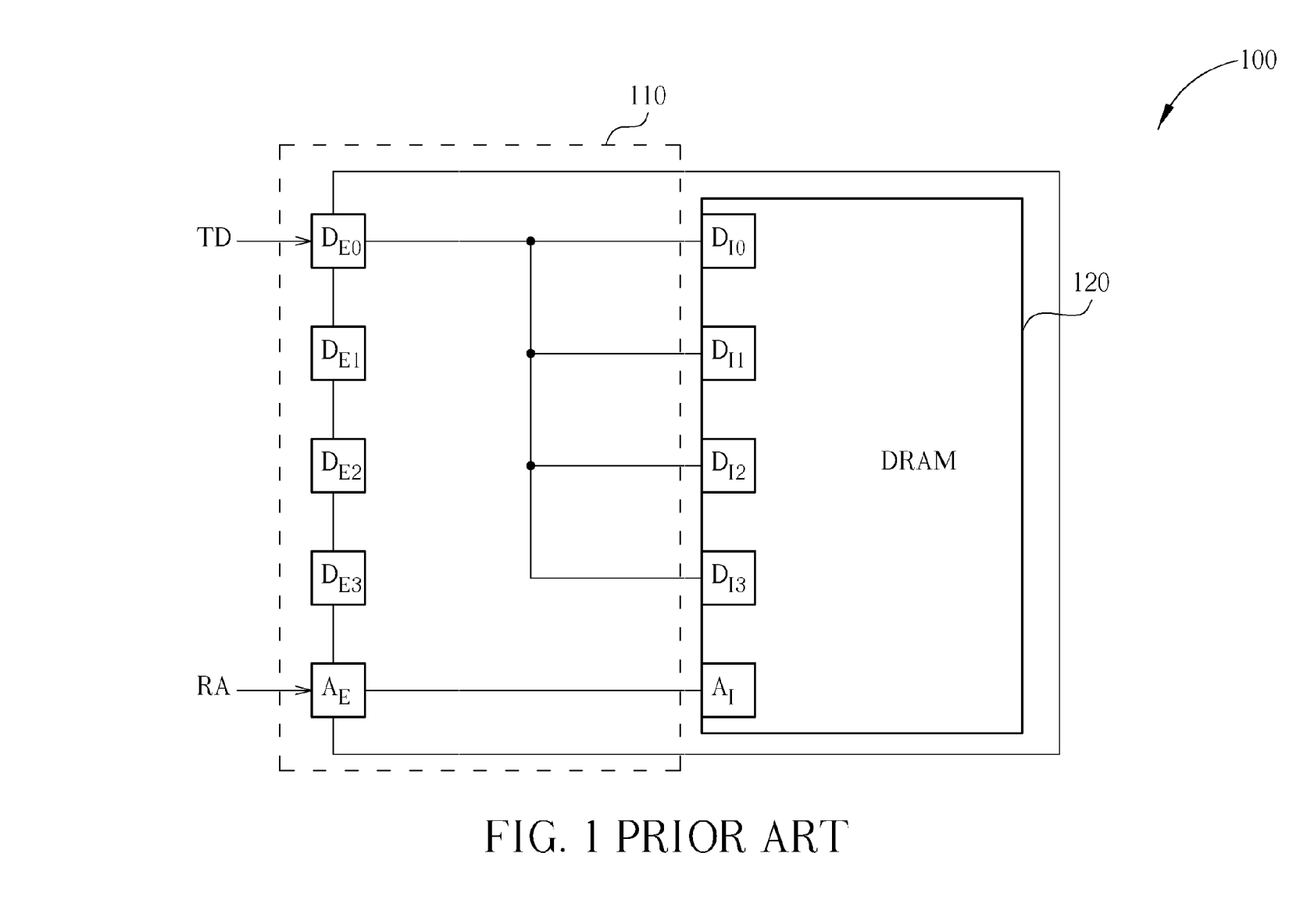
FIG. 1 is a diagram illustrating a conventional memory module during the writing phase of the testing operation under I/O compression.

Please refer to FIG. 1. FIG. 1 is a diagram illustrating a conventional memory module 100 during the writing phase of the testing operation under I/O compression. As shown in FIG. 1, the memory module 100 comprises a testing system 110 and a DRAM 120. The memory module 100 comprises module data ends $D_{E0}$, $D_{E1}$, $D_{E2}$ and $D_{E3}$, and a module address end $A_E$; similarly, the DRAM 120 comprises the memory data ends $D_{I0}$, $D_{I1}$, $D_{I2}$ and $D_{I3}$ corresponding to the module data ends $D_{E0}$, $D_{E1}$, $D_{E2}$ and $D_{E3}$, and a memory address end $A_I$ corresponding to the module address end $A_E$. The memory module 100 inputs an address to the module address end $A_E$ for accessing data from the DRAM 120 through the module data ends $D_{E0}$, $D_{E1}$, $D_{E2}$ and $D_{E3}$. During the writing phase of the testing operation under the I/O compression, the testing system 110 couples the memory data ends $D_{I0}$, $D_{I1}$, $D_{I2}$ and $D_{I3}$ together, then writes the testing data TD and the testing address RA to the module data end $D_{E0}$ and the module address end $A_E$ respectively. As a result, the testing data TD can be written into the memory cells corresponding to the testing address RA and the memory data ends $D_{I0}$, $D_{I1}$, $D_{I2}$ and $D_{I3}$ in the DRAM 120, consequently reducing the time required by the testing system 110 writing the testing data TD. Furthermore, the testing address RA may be a row address and the module data end $D_{E0}$ is utilized as an input/output end during the writing phase of the testing operation under I/O compression.

Figure 2:
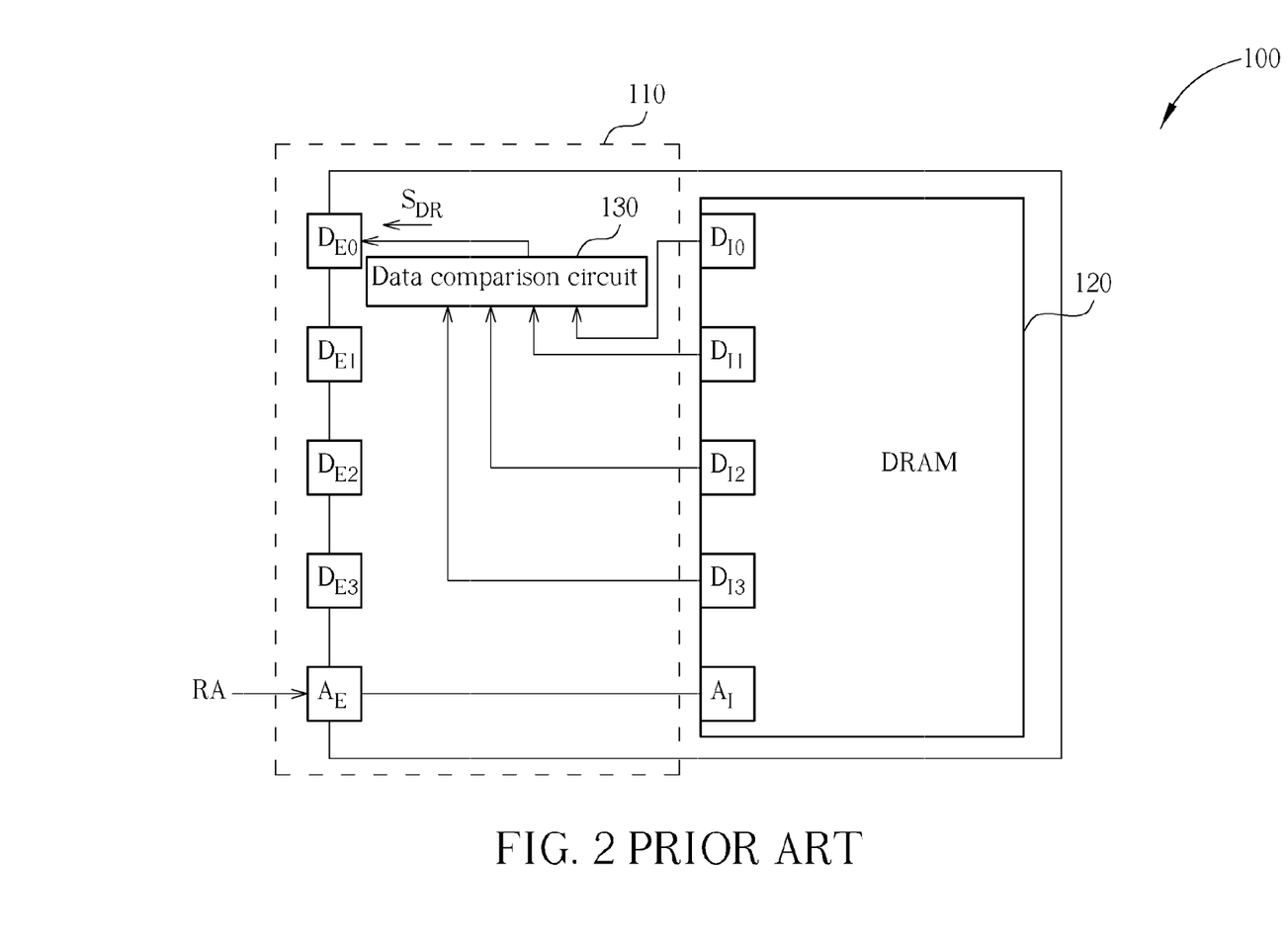
FIG. 2 is a diagram illustrating the conventional memory module during the reading phase of the testing operation under I/O compression.

Please refer to FIG. 2. FIG. 2 is a diagram illustrating the conventional memory module 100 during the reading phase of the testing operation under I/O compression. After the writing phase as shown in FIG. 1 is completed, the testing system 110 executes reading under the same I/O compression manner. In other words, the testing system 110 writes an identical testing address RA to the module address end $A_E$, so the testing address RA is transmitted to the corresponding memory address end Ai of the DRAM 120. Therefore, the corresponding memory cells in the DRAM 120 output the data that was previously written through the memory data ends $D_{I0}$, $D_{I1}$, $D_{I2}$, and $D_{I3}$ to the data comparison circuit 130. The data comparison circuit 130 then compares the received data to determine the data consistency and accordingly outputs a reading determining data $S_{DR}$ to the module data end $D_{EO}$. The reading determining data $S_{DR}$ may be logic "0", "1", or tri-state. The testing system 110 then determines if the memory cells corresponding to the address RA are damaged, according to the reading determining data $S_{DR}$.

The advantage of the testing system 110 is that the testing is executed under I/O compression for a better testing speed and efficiency. The disadvantage, however, is that all the memory cells being accessed would carry identical data. In other words, when the testing data TD is written, identical data (i.e. data with the same data pattern) are written into the memory cells corresponding to the memory data ends $D_{10}$, $D_{11}$, $D_{12}$ and $D_{13}$. For instances, if the testing data TD is logic "1", then the data written to the memory cell corresponding to the memory data ends $D_{10}$, $D_{11}$, $D_{12}$ and $D_{13}$ are [1111]; conversely if the testing data TD is logic "0", then the data written to the memory cell corresponding to the memory data ends $D_{I0}$, $D_{I1}$, $D_{I2}$ and $D_{I3}$ are [0000]. Such tendency is likely to result in testing blind spot. Since the memory cell may be damaged in various ways, for instances, stuck-at fault, transition fault, coupling fault, and Neighborhood Pattern Sensitive Fault (NPSF) etc, writing identical data to all the memory cells being tested would cause inaccurate detection of the memory faults (i.e. how the memory is damaged), consequently decreasing the accuracy of the testing system 110 and causing inconvenience.

SUMMARY OF THE INVENTION

The present invention provides a testing system for detecting memory faults of a memory. The memory comprises a first and a second memory cell. The testing system comprises a module data end, for receiving a testing data; a first writing pattern selection unit, coupled between the module data end and the first memory cell, for inverting the testing data according to a first pattern selection signal to generate a first writing pattern selection testing data, and transmitting the first writing pattern selection testing data to the first memory cell for storage; and a second writing pattern selection unit, coupled between the module data end and the second memory cell, for inverting the testing data according to a second pattern selection signal to generate a second writing pattern selection testing data, and transmitting the second writing pattern selection testing data to the second memory cell for storage.

The present invention further provides a testing system for detecting memory faults of a memory. The memory comprised N memory data ends. The testing system comprises a testing data input/output end, for receiving a testing data; a data pattern selection circuit, for generating a set of pattern selection signals; and a writing pattern selection module, disposed between the memory and the testing data input/output end, for converting the testing data to a set of writing pattern selection testing data for transmitting to N memory data ends according to the set of pattern selection signals; wherein the testing data is an one-bit testing data, the set of writing pattern selection testing data comprises N one-bit writing pattern selection testing data, each memory data end of the N memory data ends receives a corresponding bit of the N writing pattern selection testing data, and N is an integer and N>1.

The present invention further provides a method for testing if a memory is damaged. The memory having N memory data ends. The method comprises inputting a testing data; converting the test data to a set of writing pattern selection testing data for transmitting to the N memory data ends according to a set of pattern selection signals; wherein the testing data is an one-bit testing data, the set of writing pattern selection testing data comprises N one-bit writing testing data; and storing the set of writing pattern selection testing data to memory cells of the memory corresponding to a testing address; wherein N is an integer and N>1.

These and other objectives of the present invention will no doubt become obvious to those of ordinary skill in the art after reading the following detailed description of the preferred embodiment that is illustrated in the various figures and drawings.

DETAILED DESCRIPTION

Therefore, the present invention provides a novel DRAM testing system for the user to detect different kinds of memory faults under I/O compression, and effectively increasing the accuracy of the testing system. More particularly, the testing system of the present invention comprises a data pattern selection circuit for the memory cells of the DRAM to store data with different data patterns under I/O compression; therefore different kinds of memory faults can then be accurately detected.

Figure 3:
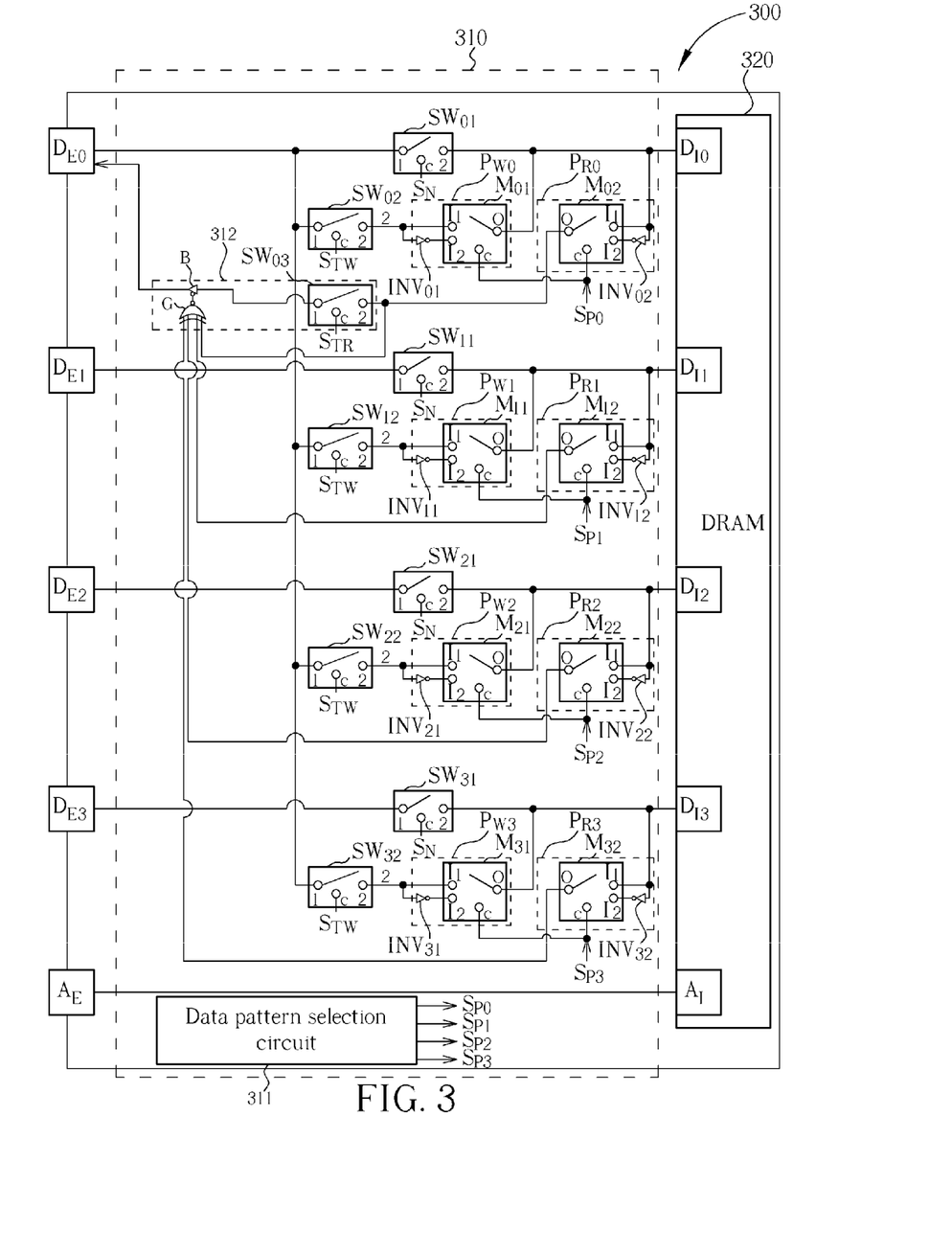
FIG. 3 is a diagram illustrating the memory module of the present invention.

Please refer to FIG. 3. FIG. 3 is a diagram illustrating the memory module 300 of the present invention. As shown in FIG. 3, the memory module 300 comprises a testing system 310 and a DRAM 320. The memory module 300 and the DRAM 320 function similar to the above-mentioned memory module 100 and the DRAM 120 respectively; the relative operational principle is omitted hereafter.

The testing system 310 comprises four normal-operation switches $SW_{01}$, $SW_{11}$, $SW_{21}$, and $SW_{31}$, four testing switches $SW_{02}$, $SW_{12}$, $SW_{22}$ and $SW_{33}$, four writing pattern selection units $P_{W0}$, $P_{W1}$, $P_{W2}$ and $P_{W3}$, four reading pattern selection units $P_{R0}$, $P_{R1}$, $P_{R2}$ and $P_{R3}$, a data pattern selection circuit 311, and a data comparison circuit 312. The data comparison circuit 312 comprises a reading switch $SW_{03}$, a data comparison logic gate G, and a buffer B.

The testing system 310 of the present invention transmits various pattern controlling signals to the writing pattern selection units and the reading pattern selection units mainly via the data pattern selection circuit 311, for inverting or retaining the testing data, so as to write to/read from the corresponding memory cells. Therefore, under I/O compression, the memory cells can then store data with different data pattern and more specifically, the DRAM can store the data of different patterns instead of a single data pattern such as [0000] or [1111]. After being processed by the data pattern selection circuit 311 and the writing pattern selection units, the data stored in the memory cells of the DRAM 320 with different patterns can be derived, for instances, [0000], [0001], [0010], [0011], [0100], [0101], [0110], [0111], [1000], [1001], [1010], [1011], [1100], [1101], [1110] and [1111] etc. In other words, the present invention utilizes a single compression test value (e.g. the module data end DEO is utilized as a testing data I/O end DEO, for writing in the testing data of one bit), and further employs the data pattern selection circuit 311 to control the writing pattern selection units, for the writing pattern selection units to generate the writing data of different patterns. For instances, in the testing operation under 1:4 I/O compression, a module data end DEO is utilized to be a testing data I/O end and the bit value inputted from the testing data I/O end $D_{EO}$ can generate 16 (i.e. $2^4$) data patterns via the processing of the data pattern selection circuit 311; in the testing operation under 1:8 I/O compression, the bit value inputted from the testing data I/O end $D_{EO}$ can generate 256 (i.e. $2^8$) data patterns via the processing of the data pattern selection circuit 311.

The data pattern selection circuit 311 sends out the pattern selection signals $S_{P0}$-$S_{P3}$ for controlling the writing pattern selection units $P_{W0}$~$P_{W3}$ and the reading pattern selection units $P_{R0}$~$P_{R3}$ to determine if the received data needs to be inverted before being outputted. The pattern selection signal $S_{P0}$ controls the writing pattern selection unit $P_{W0}$ and the reading pattern selection unit $P_{R0}$; the pattern selection signal $S_{P1}$ controls the writing pattern selection unit $P_{W1}$ and the reading pattern selection unit $P_{R1}$; the pattern selection signal $S_{P2}$ controls the writing pattern selection unit $P_{W2}$ and the reading pattern selection unit $P_{R2}$; the pattern selection signal $S_{P3}$ controls the writing pattern selection unit $P_{W3}$ and the reading pattern selection unit $P_{R3}$.

Each switch comprises a first end 1, a second 2 and a control end C, where the connection between the first end 1 and the second end 2 is controlled by the signal on the control end C. The normal-operation switches $SW_{01}$, $SW_{11}$, $SW_{21}$, and $SW_{31}$ are disposed between the corresponding module data ends and the memory data ends. For instances, the normal-operation switch $SW_{01}$ is coupled between the module data end $D_{E0}$ and the memory data end $D_{I0}$, for coupling the module data end $D_{E0}$ to the memory data end $D_{I0}$ according to the normal-operation signal $S_N$. In other words, under normal operation where the normal-operation signal $S_N$ is sent out, the module data end $D_{EO}$ is connected to the memory data end $D_{I0}$ via the normal-operation switch $SW_{01}$. On the other hand, under testing operation where the normal-operation signal $S_N$ is not sent out, the normal-operation switch $SW_{01}$ is turned off, breaking the connection between the module data end $D_{E0}$ and the memory data end $D_{I0}$. The operational principle of the other normal-operation switches functions in a similar fashion and is omitted hereafter.

The testing switches $SW_{02}$, $SW_{12}$, $SW_{22}$ and $SW_{33}$ are disposed between the module data end $D_{E0}$ and the corresponding memory data ends $D_{I0}$~$D_{I3}$. For instances, under the testing operation, when the testing data TD is written to the module data end $D_{EO}$ (the testing system 310 sends out the test writing signal $S_{TW}$ concurrently), the module data end $D_{E0}$ is coupled to the memory data end $D_{I0}$ via the testing switch $SW_{02}$ and the writing pattern selection unit $P_{W0}$ for writing the testing data TD; on the other hand, the testing switch $SW_{02}$ is turned off in other conditions. The operational principle of the other testing switches functions in a similar fashion and is omitted hereafter.

In addition, it is noticeable that the reading switch $SW_{03}$ is coupled between the reading pattern selection unit $P_{R0}$ and the buffer B. When the testing system 310 is to read the testing data previously stored, the testing system 310 sends out a test reading signal $S_{TR}$, and the reading switch $SW_{03}$ is turned on; the reading switch $SW_{03}$ is turned off in other conditions.

In a preferred embodiment, the writing pattern selection unit and the reading pattern selection unit both comprise a multiplexer and an inverter. For instances, the multiplexer $M_{01}$ comprises two input ends $I_1$ and $I_2$ and an output end O. The inverter $INV_{01}$ inverts the testing data TD for generating the inverted testing data $TD_I$ (writing pattern selection testing data). The input end $I_1$ of the multiplexer $M_{01}$ receives the testing data TD; the input end $I_2$ of the multiplexer $M_{01}$ receives the inverted testing data $TD_I$; the output end O of the multiplexer $M_{01}$ is coupled to the memory data end $D_{I0}$.

In another preferred embodiment, the control end C of the multiplexer $M_{01}$ is coupled to the data pattern selection circuit 311 for receiving the pattern selection signal $S_{P0}$. The multiplexer $M_{01}$ couples the input end $I_1$ or $I_2$ of the multiplexer $M_{O1}$ to the output end O of the multiplexer $M_{O1}$ according to the pattern selection signal $S_{P0}$. In other words, the data received by the memory data end $D_{I0}$ may be the original testing data TD, or the inverted testing data $TD_I$, depending on the pattern selection signal $S_{P0}$ (i.e. the writing pattern selection testing data). In this way, the data pattern selection circuit 311 can then select/control the data pattern to be written to the memory data end $D_{I0}$ via the writing pattern selection unit $P_{W0}$; the data pattern selection circuit 311 can select/control the data pattern to be written to the memory data ends $D_{I1} \sim D_{I3}$ via the corresponding writing pattern selection units $P_{W1} \sim P_{W3}$, respectively. Simply put, in the testing operation under 1:4 I/O compression, the data pattern selection circuit 311 can output the pattern selection signal of 4 bits. In another preferred embodiment, the control end C of the multiplexer $M_{O1}$ can be directly coupled to a reference voltage source (e.g. the ground) so that the writing pattern selection units $P_{W1} \sim P_{w3}$ are coupled to the data pattern selection circuit 311. In other words, the writing pattern selection unit $P_{W0}$ directly outputs the testing data TD, and the writing pattern selection units $P_{W1} \sim P_{W3}$ output the testing data TD or the inverted testing data $TD_I$. Simply put, in the testing operation under 1:4 I/O compression, the data pattern selection circuit 311 can only output the pattern selection signal of 3 bits.

Figure 4:
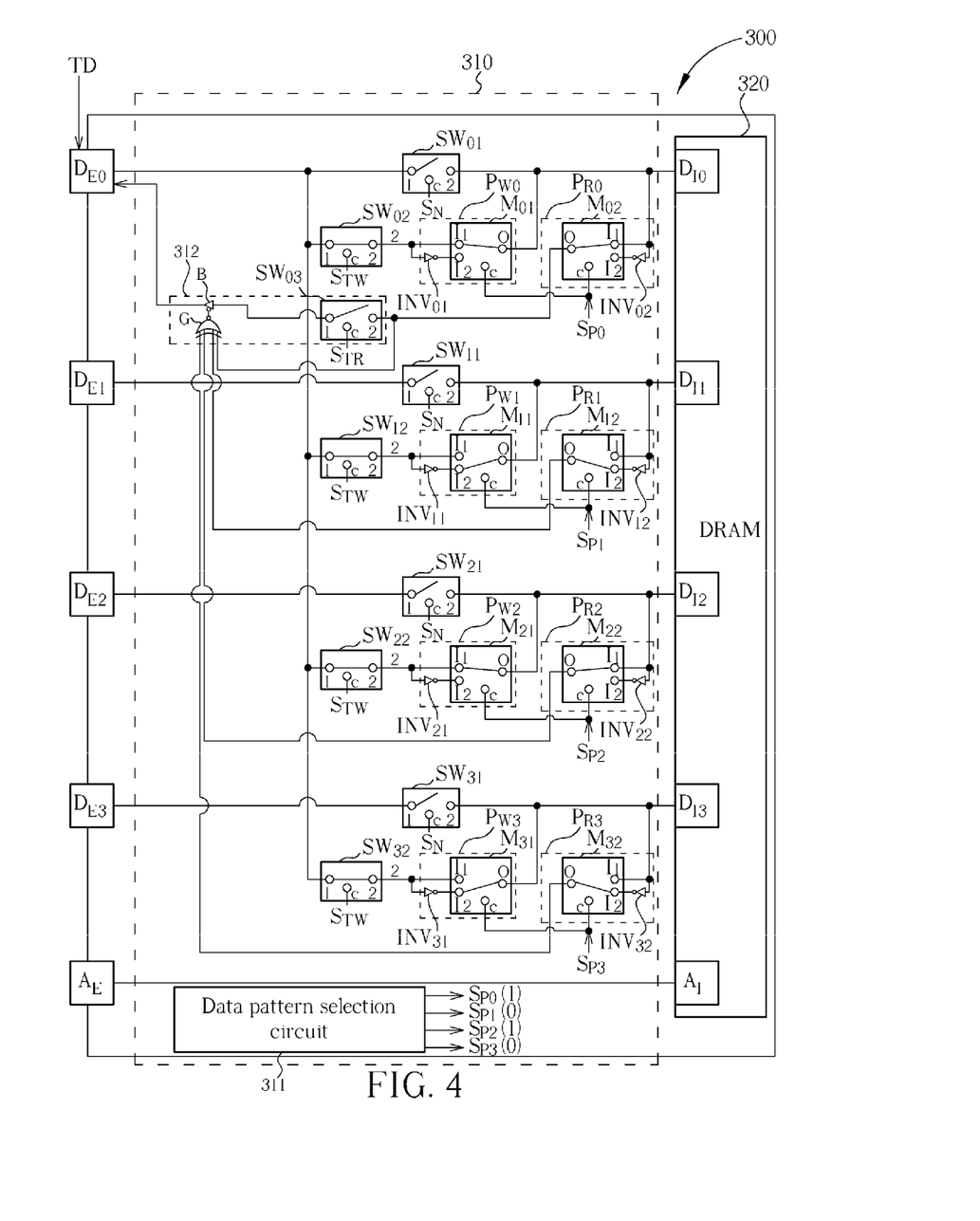
FIG. 4 is a diagram illustrating the testing system of the present invention during the writing phase of the testing operation.

Please refer to FIG. 4. FIG. 4 is a diagram illustrating the testing system 310 of the present invention during the writing phase of the testing operation. In the following description, it is assumed that the multiplexer of the present invention is configured so that when the multiplexer receives the control signal of logic "1", the input end Ii of the multiplexer is coupled to the output end O of the multiplexer; when the multiplexer receives the control signal of logic "0", the input end $1_2$ of the multiplexer is coupled to the output end O of the multiplexer. If the pattern selection signal outputted from the data pattern selection circuit 311 is [1010], the pattern selection signals $S_{P0}$, $S_{P1}$, $S_{P2}$ and $S_3$ are logic "1", "0", "1", and "0" respectively. Therefore, after processed by the writing pattern selection units $P_{W0}$-$P_{W3}$, the actual data being written to the memory data ends $D_{I0} \sim D_{I3}$ are testing data TD, $TD_I$, TD, and $TD_I$ (i.e. the writing pattern selection testing data). For instances, if the testing data TD is logic "0", then the data [0101] are respectively written to the memory data ends $D_{I0} \sim D_{I3}$; if the testing data TD is logic "1", then the data [1010] are respectively written to the memory data ends $D_{10} \sim D_{13}$. In this way, the memory cells corresponding to the memory data ends $D_{I0} \sim D_{I3}$ and the testing address RA can store data of different patterns, subsequently the data pattern selection circuit 311 can then control if the writing pattern selection units inverts the testing data or not, so as to control the actual data pattern being written to the memory cells. In another preferred embodiment, the data pattern selection signal sent out from the data pattern selection circuit 311 may be [010]. That is, the pattern selection signal $S_{P1}$ of logic "0", the pattern selection signal $S_{P2}$ of logic "1", and the selection signal $S_{P3}$ of logic "0" are sent to the writing pattern selection units $P_{W1} \sim P_{W3}$ respectively, and the control end C of the multiplexer $M_{O1}$ of the writing pattern selection unit $P_{W0}$ can be directly coupled to a high voltage source for receiving a high voltage level (i.e. $S_{P0}$ is logic "1"). In this way, the data [1010] can still be respectively written to the memory data ends $D_{I0} \sim D_{I3}$.

Figure 5:
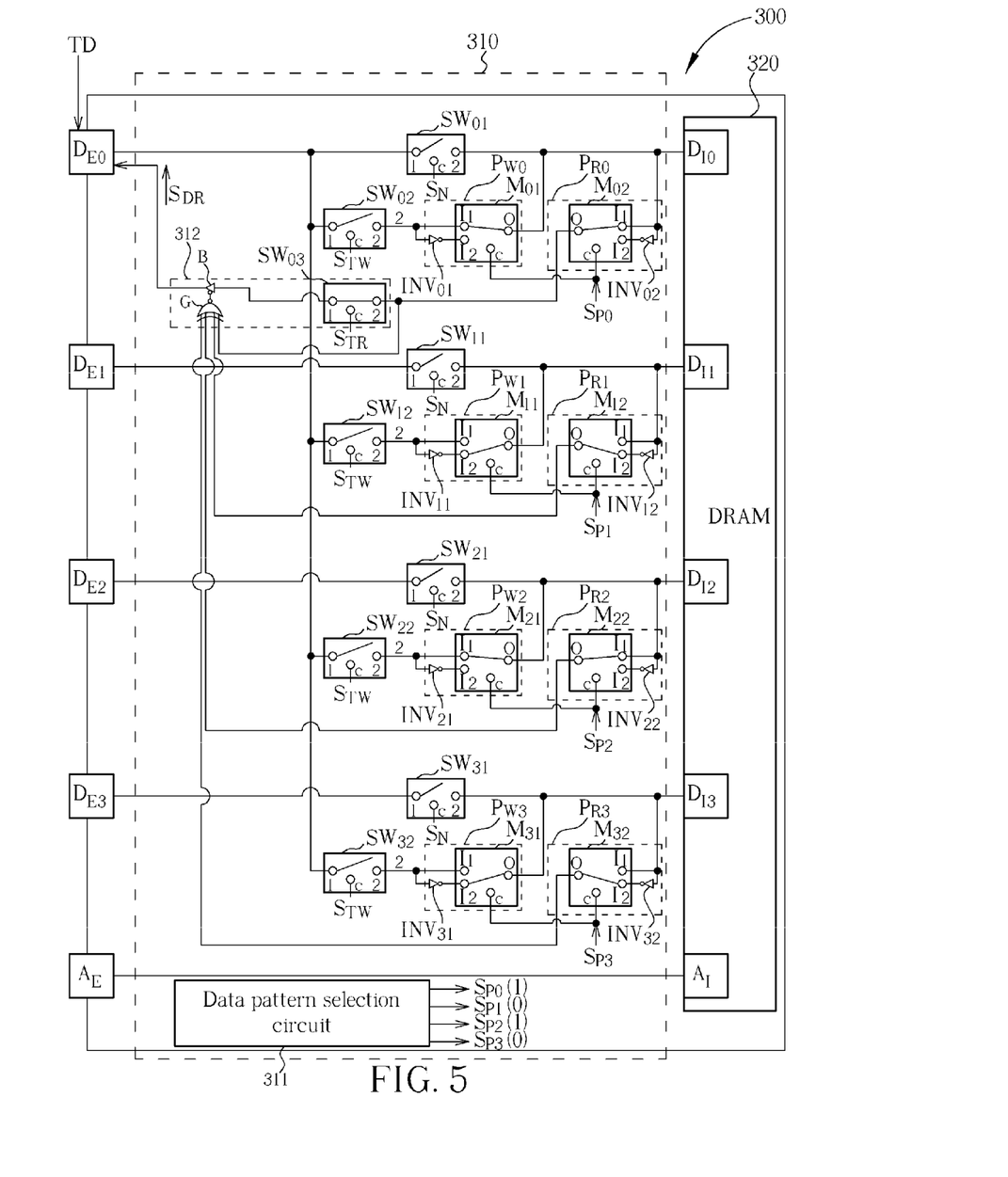
FIG. 5 is a diagram illustrating the testing system of the present invention during the reading phase of the testing operation.

Please refer to FIG. 5. FIG. 5 is a diagram illustrating the testing system 310 of the present invention during the reading phase of the testing operation. FIG. 5 explains the on/off status of each switch, where only the reading switch $SW_{O3}$ is turned on. The pattern selection signal [1010] from the above-mentioned writing phase has been transmitted by the data pattern selection circuit 311, so the data pattern circuit 311 still requires to transmit the identical pattern selection signal [1010] during the reading phase of the testing operation. That is, the pattern selection signals $S_{P0}$, $S_{P1}$, $S_{P2}$ and $Sp_3$ still are logic "1", "0", "1", and "0" respectively. Assuming the writing pattern selection data have been stored without any errors, during the reading phase of the testing operation, the data read from the memory cells corresponding to the memory data ends $D_{I0} \sim D_{I3}$ and the testing address RA are the testing data TD, $TD_I$, TD, and $TD_I$. In this way, after the reading pattern selection units $P_{R0} \sim P_{R3}$ determine if the inversion is performed, the reading data should be TD, TD, TD, and TD outputted from the reading pattern selection units $P_{R0} \sim P_{R3}$, respectively. When the memory cells are normally operated without any errors, the actions above are for the writing pattern selection data of different logics (i.e. different patterns) stored previously in the memory units to be read out and converted to data of identical logics for the data comparison circuit 312 to operate. In another preferred embodiment, the data pattern selection circuit 311 sends out the pattern selection signal of [010], where the pattern selection signals $S_{p1}$ of logic "0", $S_{p2}$ of logic "1", and $S_{p2}$ of logic "0" are transmitted to $P_{R1} \sim P_{R3}$ respectively, and the control end C of the multiplexer $M_{O2}$ of $P_{R0}$ directly receives a high voltage level (i.e. indicating the pattern selection signal $S_{P0}$ is logic "1"), consequently identical reading result can still be achieved.

For instances, if the original test data TD for writing is logic "0", the corresponding final data output from the reading pattern selection units $P_{R0} \sim P_{R3}$ are [0000] (assuming the corresponding memory cells in DRAM are not damaged); if the original test data TD for writing is logic "1", the final data outputted from the reading pattern selection units $P_{R0} \sim P_{R3}$ are [1111] (assuming the corresponding memory cells in DRAM are not damaged). Because the reading switch $SW_{O3}$ is turned on, the data outputted from the reading pattern selection unit $P_{R0}$ is transmitted to the module data end $D_{E0}$ via the buffer B. Subsequently the signal the buffer B sends out is the reading determining data $S_{DR}$. Also, the data outputted from the reading pattern selection units $P_{R0} \sim P_{R3}$ are sent to the data comparison logic gate G. The data comparison logic gate G compares/determines if the data received from the reading pattern selection units $P_{R0} \sim P_{R3}$ are consistent/matched, and sends an enabling signal to the buffer B accordingly. More specifically, if the data received from reading pattern selection units $P_{R0} \sim P_{R3}$ are consistent, then the data comparison logic gate G sends the enabling signal representing enable to the buffer B, and the buffer B can send out the received data (i.e. the reading determining data $S_{DR}$) sent from the reading pattern selection unit $P_{R0}$. On the contrary, if the data received from the reading pattern selection units $P_{R0} \sim P_{R3}$ are inconsistent data (indicating the corresponding memory cells are damaged), then the data comparison logic gate G sends the enabling signal representing disable to the buffer B, and the buffer B is unable to send out data, causing the output end of the buffer B to be at tri-state, which indicates the reading determining data $S_{DR}$ outputted from the buffer B is of a high resistance. Therefore, the testing system of the present invention determines if the corresponding memory cells are damaged according to the status (i.e. logic "1" or "0" or tri-state) of the data read from the buffer B. More specifically, if the output of the buffer B is tri-state, the testing system 310 then determines the corresponding memory cells are damaged; if the output of the buffer B is logic "0" or "1", then the output has to be compared with the testing data TD to determine if the corresponding memory cells are damaged. Furthermore, the data comparison logic gate G can be realized with an exclusive NOR gate.

Figure 6:
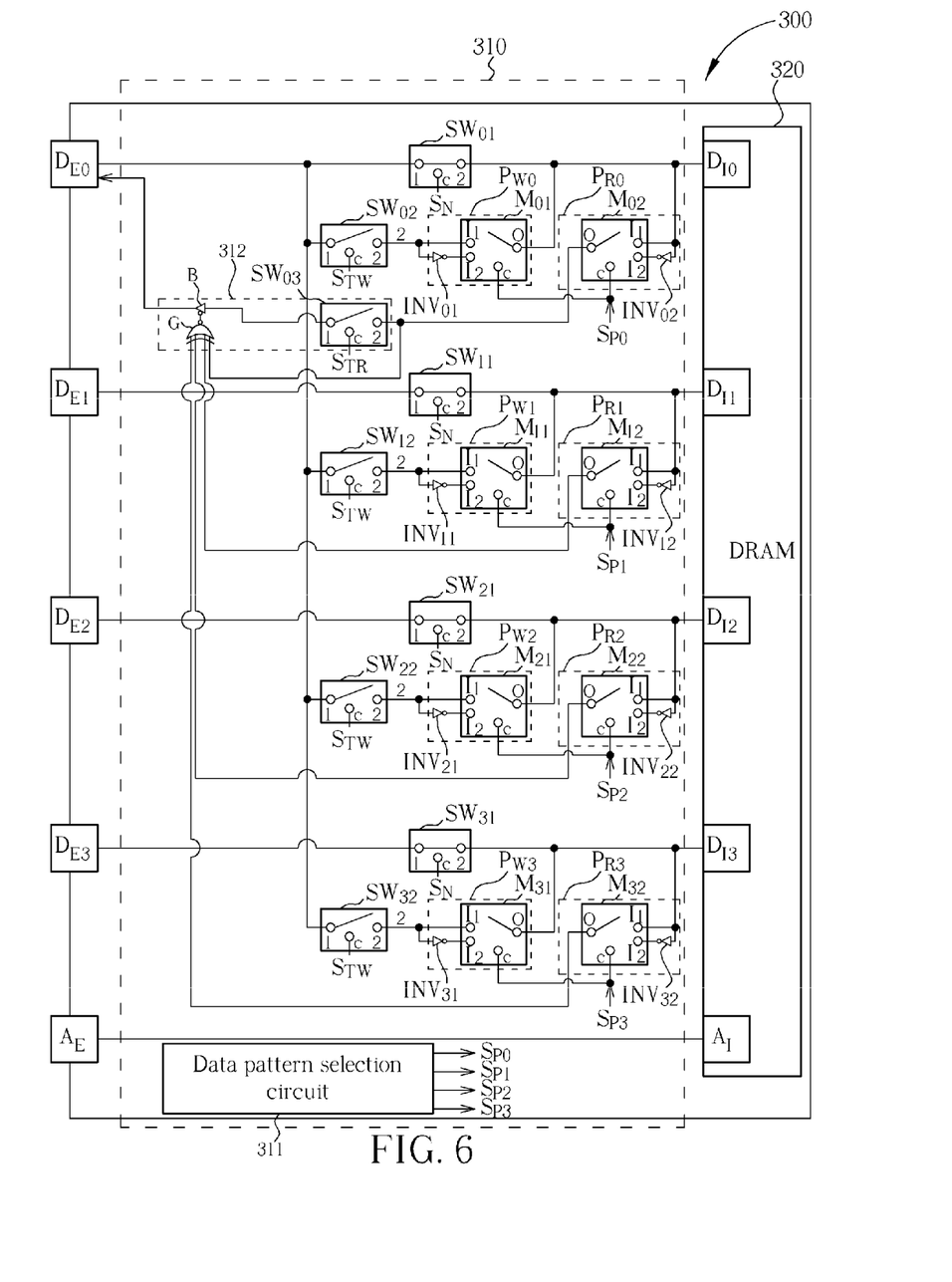
FIG. 6 is a diagram illustrating the testing system of the present invention in the normal operation.

Please refer to FIG. 6. FIG. 6 is a diagram illustrating the testing system 310 of the present invention in the normal operation. As shown in FIG. 6, in the normal operation, the normal operation signal SN is sent out to turn on only the normal-operation switches $SW_{01}$, $SW_{11}$, $SW_{21}$, and $SW_{31}$, for the DRAM 320 to interact with the external circuit via the module data ends $D_{E0}$~$D_{E3}$ and the module address end $A_E$ so the external circuit can access the stored data of the DRAM 320.

Furthermore, the number of the data ends of the memory module and memory mentioned in the present invention are only illustrated as an exemplary embodiment for aiding the user to gain a better grasp of the present invention. The actual number of the data ends and the relative components are not limited to the illustrated embodiments of the present invention and can be modified or altered as desired.

In conclusion, under I/O compression, the DRAM testing system of the present invention is able to provide data of different pattern to the DRAM for detecting different kinds of memory faults. In this way, the accuracy of the testing system is increased and the damaged DRAM memory cells can be effectively detected, providing great convenience.

Those skilled in the art will readily observe that numerous modifications and alterations of the device and method may be made while retaining the teachings of the invention.

What is claimed is:

1. A testing system for detecting memory faults of a memory, the memory comprising a first and a second memory cell, the testing system comprising:
   a module data end, for receiving a testing data;
   a first writing pattern selection unit, coupled between the module data end and the first memory cell, for inverting the testing data according to a first pattern selection signal to generate a first writing pattern selection testing data, and transmitting the first writing pattern selection testing data to the first memory cell for storage;
   a second writing pattern selection unit, coupled between the module data end and the second memory cell, for inverting the testing data according to a second pattern selection signal to generate a second writing pattern selection testing data, and transmitting the second writing pattern selection testing data to the second memory cell for storage;
   a data pattern selection circuit, coupled between the first and second writing pattern selection units, for generating the first and the second pattern selection signals;
   a first reading pattern selection unit, coupled between the module data end and the first memory cell, for inverting data read from the first memory cell to generate a first reading pattern selection testing data, according to the first pattern selection signal;
   a second reading pattern selection unit, coupled between the module data end and the second memory cell, for inverting data read from the second memory cell to generate a second reading pattern selection testing data, according to the second pattern selection signal; and
   a data comparison circuit, for determining if the first or the second memory cells is damaged, the data comparison circuit comprising:
      a data comparison logic gate, for receiving the first and the second reading pattern selection testing data, for generating an enabling signal accordingly; and
      a buffer, coupled to the first memory cell, for outputting a reading determining data according to the enabling signal;
   wherein when the first and the second reading pattern selection testing data are not matched, the enabling signal represents disable for disabling the buffer, the reading determining data is of tri-state, and the testing system determines the first or the second memory cell to be damaged.

2. The testing system of claim 1, wherein when the first pattern selection signal is of a first predetermined logic, the first writing pattern selection unit does not invert the testing data so the first writing pattern selection testing data equals to the testing data, the first reading pattern selection unit does not invert data read from the first memory cell for generating the first reading pattern selection testing data; when the first pattern selection signal is of a second predetermined logic, the first writing pattern selection unit inverts the testing data for the first writing pattern selection testing data inverting from the testing data, the first reading pattern selection unit inverts data read from the first memory cell to generate the first reading pattern selection testing data.

3. The testing system of claim 2, wherein when the second pattern selection signal is of the first predetermined logic, the second writing pattern selection unit does not invert the testing data for the second writing pattern selection testing data equaling to the testing data, the second reading pattern selection unit does not invert data read from the second memory cell to generate the second reading pattern selection testing data; when the second pattern selection signal is of the second predetermined logic, the second writing pattern selection unit inverts the testing data for the second writing pattern selection testing data inverting from the testing data, the second reading pattern selection unit inverts data read from the second memory cell to generate the second reading pattern selection testing data.

4. The testing system of claim 1, wherein the data comparison logic gate is an exclusive NOR gate.

5. The testing system of claim 1, wherein when the first and the second reading pattern selection testing data are matched, the enabling signal represents enable for enabling the buffer to send out the first reading pattern selection testing data, the reading determining data is the first reading pattern selection testing data, and the testing system determines the first or the second memory cell to be damaged according to the testing data and the reading determining data.

6. A testing system for detecting memory faults of a memory, the memory comprising N memory data ends, the testing system comprising:
   a testing data input/output end, for receiving a one-bit testing data;
   a data pattern selection circuit, for generating a set of pattern selection signals;
   a writing pattern selection module, disposed between the memory and the testing data input/output end, for converting the testing data to a set of writing pattern selection testing data comprising N one-bit writing pattern selection testing data for transmitting to N corresponding memory data ends according to the set of pattern selection signals;
   a reading pattern selection module comprising N reading pattern selection units, coupled to the N memory data ends, for converting a set of reading data comprising N one-bit reading data outputted from the N memory data ends to a set of reading pattern selection testing data comprising N one-bit reading testing data according to the set of pattern selection signals; and a data comparison circuit, disposed between the reading pattern selection module and the testing data input/output end, for selectively generating a one-bit testing result data to the testing data input/output end according to the set of reading pattern selection testing data, a fourth reading pattern selection unit of the N reading pattern selection unit being disposed between the data comparison circuit and a fourth memory data end of the N memory data ends, the fourth reading pattern selection unit inverting a fourth reading data of one bit outputted from the fourth memory data end for generating a fourth inverted reading data of one bit, and the fourth reading pattern selection unit selectively outputting the fourth inverted reading data of one bit or the fourth reading data of one bit to the data comparison circuit according to a reference voltage, the data comparison circuit comprising:

a buffer;

a reading switch, disposed between the fourth reading pattern selection unit and the buffer, for selectively coupling the fourth reading pattern selection unit to the buffer according to a test reading signal; and an exclusive NOR gate, for performing exclusive NOR calculation to the set of reading pattern selection testing data to generate an enabling signal;

wherein the buffer selectively couples the reading switch to the testing data input/output end according to the enabling signal, and N is an integer and N>1.

7. The testing system of claim 6, wherein the writing pattern selection module comprises N writing pattern selection units, a third writing pattern selection unit is disposed between the testing data input/output end and a third memory data end of the N memory data ends, the third writing pattern selection unit inverts the testing data for generating an inverted testing data, and the third writing pattern selection unit selectively outputs the inverted testing data or the testing data to the third memory data end, according to a third pattern selection signal of the set of pattern selection signals.

8. The testing system of claim 6, wherein the writing pattern selection module comprises N writing pattern selection units, a fourth writing pattern selection unit is disposed between the testing data input/output end and a fourth memory data end of the N memory data ends, the fourth writing pattern selection unit inverts the testing data for generating an inverted testing data, and the fourth writing pattern selection unit selectively outputs the inverted testing data or the testing data to the fourth memory data end according to a reference voltage.

9. The testing system of claim 6, wherein a third reading pattern selection unit of the N reading pattern selection units is disposed between the data comparison circuit and a third memory data end of the N memory data ends, the third reading pattern selection unit inverts a third reading data of one bit outputted from the third memory data end for generating a third inverted reading data of one bit, and the third reading pattern selection unit selectively outputs the third inverted reading data of one bit or the third reading data of one bit to the data comparison circuit according to a third pattern selection signal of the set of pattern selection signals.

10. The testing system of claim 6, wherein when the enabling signal represents enable, the buffer outputs the testing result data to the testing data input/output end.

11. The testing system of claim 6, wherein when the enabling signal represents disable, the buffer outputs a tri-state signal for representing the memory is damaged.

12. A method for testing if a memory is damaged, the memory having N memory data ends, the method comprising:

inputting a one-bit testing data;

converting the testing data to a set of writing pattern selection testing data comprising N one-bit writing testing data for transmitting to the N memory data ends according to a set of pattern selection signals;

storing the set of writing pattern selection testing data to memory cells of the memory corresponding to a testing address;

reading a set of reading data from the memory cells corresponding to the testing address;

converting the set of reading data to a set of reading pattern selection testing data according to the set of pattern selection signals;

wherein the set of reading pattern selection testing data comprises N one-bit reading testing data comparing the N one-bit reading testing data for generating an enabling signal; and selectively outputting a testing result data selected from one of the N one-bit reading testing data according the enabling signal;

wherein when the enabling signal represents enable, the testing result data is outputted; when the enabling signal represents disable, the testing result data is not outputted indicating the memory is damaged, N is an integer and N>1.

13. The method of claim 12, wherein the set of pattern selection signals comprises (N−1) one-bit pattern selection signals.

14. The method of claim 12, wherein the set of pattern selection signals comprises N one-bit pattern selection signals.

15. The method of claim 12, further comprising:

comparing the testing result data and the testing data for determining if the memory is damaged.

16. A testing system for detecting memory faults of a memory, the memory comprising a first and a second memory cell, the testing system comprising:

a module data end, for receiving a testing data;

a first writing pattern selection unit, coupled between the module data end and the first memory cell, for inverting the testing data according to a first pattern selection signal to generate a first writing pattern selection testing data, and transmitting the first writing pattern selection testing data to the first memory cell for storage;

a second writing pattern selection unit, coupled between the module data end and the second memory cell, for inverting the testing data according to a second pattern selection signal to generate a second writing pattern selection testing data, and transmitting the second writing pattern selection testing data to the second memory cell for storage;

a data pattern selection circuit, coupled between the first and second writing pattern selection units, for generating the first and the second pattern selection signals;

a first reading pattern selection unit, coupled between the module data end and the first memory cell, for inverting data read from the first memory cell to generate a first reading pattern selection testing data, according to the first pattern selection signal;

a second reading pattern selection unit, coupled between the module data end and the second memory cell, for inverting data read from the second memory cell to generate a second reading pattern selection testing data, according to the second pattern selection signal; and a data comparison circuit, for determining if the first or the second memory cells is damaged, the data comparison circuit comprising:

a data comparison logic gate, for receiving the first and the second reading pattern selection testing data, for generating an enabling signal accordingly; and a buffer, coupled to the first memory cell, for outputting a reading determining data according to the enabling signal;

wherein when the first and the second reading pattern selection testing data are matched, the enabling signal represents enable for enabling the buffer to send out the first reading pattern selection testing data, the reading determining data is the first reading pattern selection testing data, and the testing system determines the first or the second memory cell to be damaged according to the testing data and the reading determining data.

* * * * *

UNITED STATES PATENT AND TRADEMARK OFFICE
CERTIFICATE OF CORRECTION

PATENT NO.       : 8,201,035 B2
APPLICATION NO.  : 12/616149
DATED            : June 12, 2012
INVENTOR(S)      : Shih-Hsing Wang et al.

Page 1 of 1

It is certified that error appears in the above-identified patent and that said Letters Patent is hereby corrected as shown below:

On the title page, item (75), correct the address of the second inventor from "Yaoyuan County" to --Taoyuan County--.

Signed and Sealed this
Fourteenth Day of August, 2012

David J. Kappos
*Director of the United States Patent and Trademark Office*